US009604348B2

(12) United States Patent
Wu et al.

(10) Patent No.: US 9,604,348 B2
(45) Date of Patent: Mar. 28, 2017

(54) TOOL FOR CATCHING IC PACKAGE

(71) Applicant: FOXCONN INTERCONNECT TECHNOLOGY LIMITED, Grand Cayman (KY)

(72) Inventors: Heng-Kang Wu, Shenzhen (CN); Quan Wang, Shenzhen (CN); Tzu-Li Chu, New Taipei (TW); Fu-Jin Peng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/009,849

(22) Filed: Jan. 29, 2016

(65) Prior Publication Data

US 2016/0229048 A1 Aug. 11, 2016

(30) Foreign Application Priority Data

Feb. 6, 2015 (CN) .......................... 2015 1 0061905

(51) Int. Cl.
*H05K 3/30* (2006.01)
*B25B 9/02* (2006.01)

(52) U.S. Cl.
CPC ...................................... *B25B 9/02* (2013.01)

(58) Field of Classification Search
CPC ........... H05K 13/0404; H05K 13/0491; H05K 13/0413; H05K 13/0408; H01R 13/6335
USPC .................................... 29/740, 741; 439/484
See application file for complete search history.

(56) References Cited

U.S. PATENT DOCUMENTS 4,141,138 A * 2/1979 Quick ................ H05K 13/0417 29/740
4,873,761 A * 10/1989 Korsunsky ......... H05K 13/0491 29/268
5,479,669 A * 1/1996 Chen .................. H05K 13/0092 29/758
5,566,445 A * 10/1996 Piao .................. H05K 13/0447 29/741
6,634,891 B1 10/2003 Cheng
7,997,920 B1 * 8/2011 Sun .................... H01R 13/6275 439/345

* cited by examiner

*Primary Examiner* — Hien Vu
(74) *Attorney, Agent, or Firm* — Wei Te Chung; Ming Chieh Chang

(57) ABSTRACT

A tool for catching an IC package comprises a main body, a plurality of operation arms and a plurality of clamping arms. The main body has a base and a plurality of lateral portions rotating relative to the base. The operation arms each extends upwardly from a top portion of a corresponding lateral portion. The clamping arms each extends downwardly from a lateral portion and is formed with a clasping portion at a free end thereof, the clasping portion has a latching slot. The operation arms bring the lateral portions to rotate inwardly and open the clamping arms.

11 Claims, 5 Drawing Sheets

TOOL FOR CATCHING IC PACKAGE

1. FIELD OF THE INVENTION

The present invention relates to a tool, and more particularly to a tool for catching an IC package.

2. DESCRIPTION OF THE PRIOR ART

Electrical connector is widely used for electrically connecting an IC package to a printed circuit board. The electrical connector includes an insulative housing and a plurality of terminals received in the insulative housing. The insulative housing includes a bottom wall and a plurality of side walls extending upwardly from the bottom wall. The bottom wall and the side walls all form a receiving space. The bottom wall includes a plurality of holes for receiving the terminals. Each of the terminals includes a contact arm extending into the receiving space and a tail equipped with a solder ball. The terminals of the electrical connector are soldering to the printed circuit board with the solder balls being heated to melt. When the electrical connector is using, the IC package is received in the receiving space of the electrical connector, and the contact arm of the terminal is electrically connected with a conductive gasket at the bottom of the IC package, and the electrical connector brings a signal to the printed circuit board. However, if the IC package is assembled into the receiving space by fingers, the fingers will cause a deformation of the terminals by touching the terminals, moreover, the IC package may fall off to damage the terminals.

It is desired to obtain a new tool for catching an IC package.

SUMMARY OF THE INVENTION

Accordingly, an object of the present invention is to provide a new tool for catching an IC package.

In order to achieve the object set forth, a tool for catching an IC package comprises a main body, a plurality of operation arms and a plurality of clamping arms. The main body has a base and a plurality of lateral portions rotating relative to the base. The operation arms each extends upwardly from a top portion of a corresponding lateral portion. The clamping arms each extends downwardly from a lateral portion and is formed with a clasping portion at a free end thereof, the clasping portion has a latching slot. The operation arms bring the lateral portions to rotate inwardly and open the clamping arms.

DESCRIPTION OF PREFERRED EMBODIMENT

Reference will now be made to the drawings to describe the present invention in detail.

Figure 1:
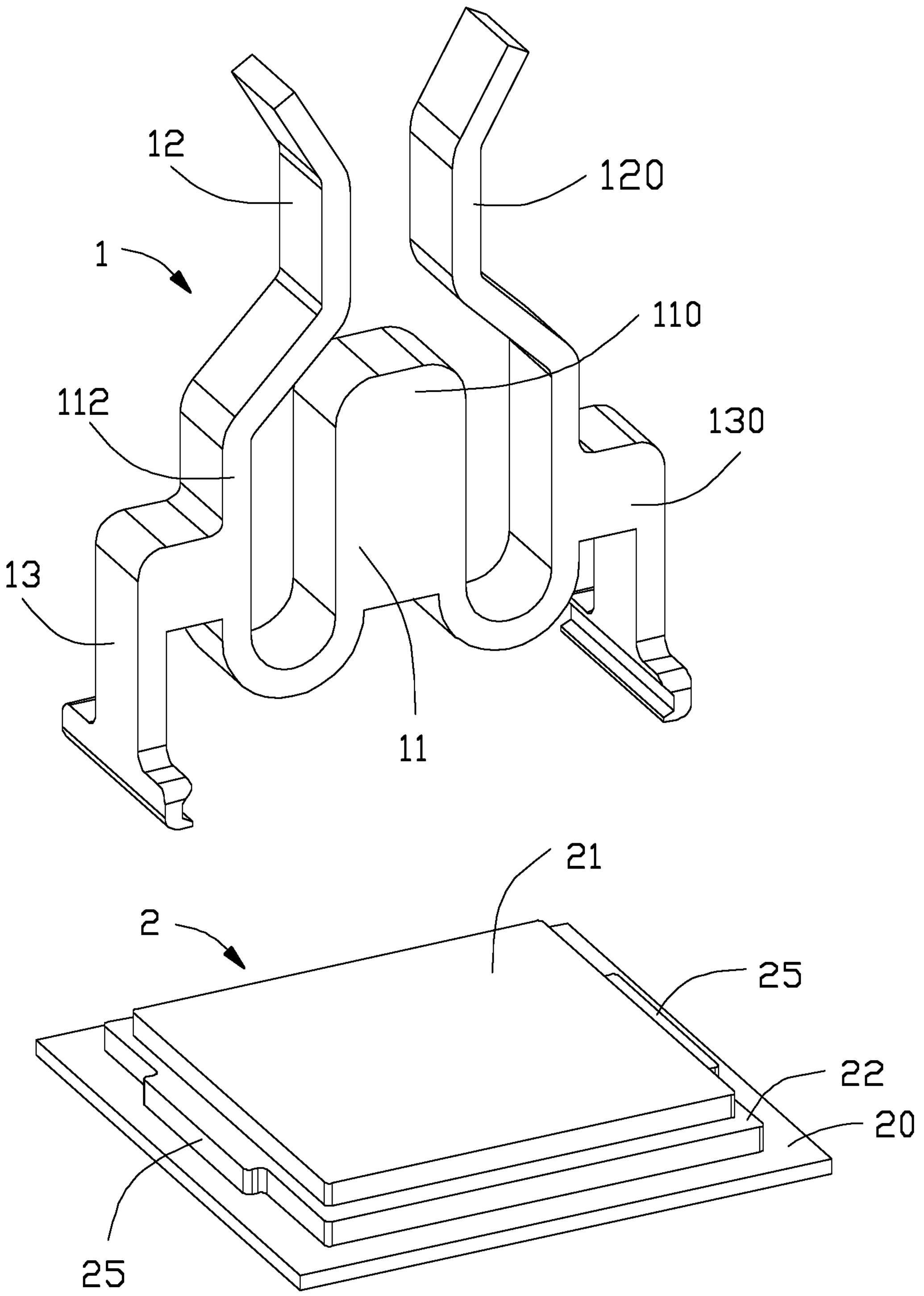
FIG. 1 is a perspective view of a IC package and a tool for catching the IC package in accordance with the present invention.
Figure 2:
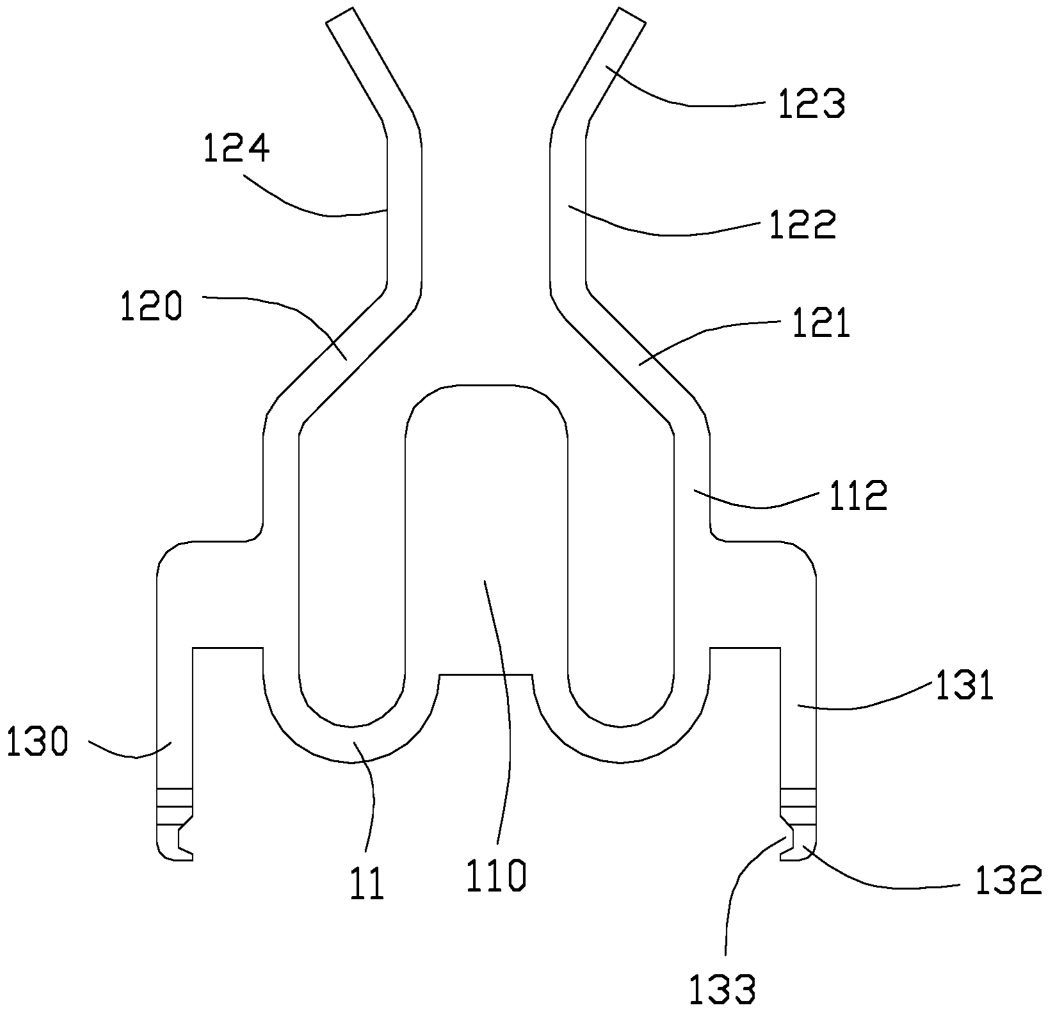
FIG. 2 is a front view of the tool.
Figure 3:
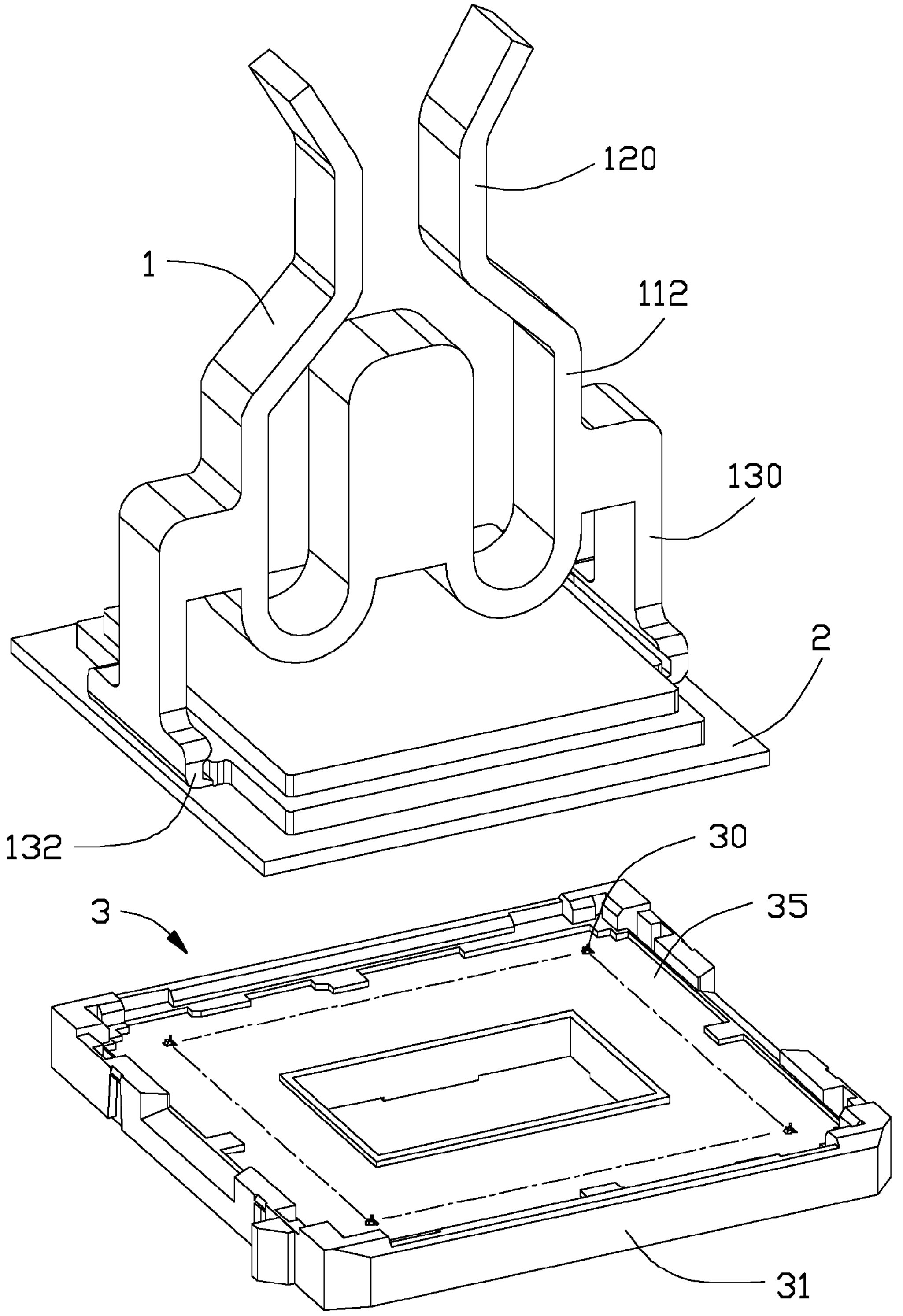
FIG. 3 is a schematic view showing the tool catching the IC package to assemble the IC package to the electrical connector.

Referring to FIGS. 1-3, a tool 1 is used for clamping an IC package 2 and placing the IC package 2 into an electrical connector 3, instead of taking and placing the IC package 2 by fingers, any terminal 30 of the electrical connector 3 will not be touched and be damaged. The structure of the tool 1 is described in detail as below.

Referring to FIGS. 1-3, the tool 1 includes a main body 11, an operation portion 12 and a clamping portion 13. The main body 11 generally defining a W-shaped configuration in a front view, includes a base 110 and two lateral portions 112 on two sides of the base 110 in a transverse direction. Each of the lateral portions 112 connects with the base 110 at a bottom portion thereof to form a U-shaped structure. The lateral portion 112 can rotate relative to the base 110 elastically. An arrange direction of the base 110 and the lateral portions 112 define a longitudinal direction. In order to increase an intensity of the base 110, the width of the base 110 along the longitudinal direction is large. In order to achieve a better elastic effect, the width of the lateral portion 112 along the longitudinal direction is thin.

The operation portion 12 includes two operation arms 120 each extending upwardly from a top portion of a corresponding lateral portion 112. The operation arm 120 includes a first segment 121, a second segment 122 extending from the top of the first segment 121 along a vertically upward direction and a third segment 123 extending from the top of the second segment 122 upwardly and outwardly along an inclined direction. The first segment 121 extends from the top of the lateral portion 112 of the main body 11 to the base 110 upwardly and inwardly along an inclined direction. The operation arm 120 forms a notch 124 opening outwardly with the help of the first segment 121, the second segment 122 and the third segment 123. The notch 124 is for an operator to place the fingers.

The clamping portion 13 includes two clamping arms 130 each extending from the lateral portion 112. The clamping arm 130 includes a connecting segment 131 and a clasping portion 132 located at an end of the connecting segment 131. The connecting segment 131 presents an inverted L-shaped structure. The connecting segment 131 includes a horizontal portion extending from a middle-lower part of the lateral portion 112 outwardly and a vertical portion extending from the horizontal portion downwardly. The clasping portion 132 defines a holding or latching slot 133 opening inwardly, and the holding slot 133 runs through the clasping portion 132 along a front-to-rear direction. The tool 1 has a same thickness except for the clasping portion 132. That is to say, the tool 1 has a same thickness along the front-to-rear direction perpendicular to the longitudinal direction. The clasping portion 132 has a larger thickness in order to ensure an intensity. The operator presses the second segments 122 of the operation arms 120 to provide an inward force, the operation arm 120 will bring the top of two lateral portions 112 to rotate inwardly, and the lateral portion 112 will bring the clasping portion 132 to open outwardly. When the operation arms 120 are released, the clasping portion 132 will restore to an original position.

Referring to FIG. 1 and FIG. 3, the electrical connector 3 includes an insulative housing 31 and a plurality of terminals 30 received in the insulative housing 31. The insulative housing 31 defines a receiving space 35 to receive the IC package 2. The IC package 2 presents a rectangle. The IC package 2 includes a base plate 20, a projecting portion 21 and a middle plate 22 located between the base plate 20 and the projecting portion 21. The length and the width of the base plate 20 is larger than the length and the width of the middle plate 22, the length and the width of the middle plate 22 is larger than the length and the width of the projecting portion 21. The base plate 20, the middle plate 22 and the projecting portion 21 present a ladder-shaped structure. The length and the width of the base plate 20 is almost same with the length and the width of the receiving space 35 of the electrical connector 3. The IC package 2 includes two flanges 25 protruding outwardly from two sides of the middle plate 22 respectively. The flange 25 is used for clamping with the holding slot 133.

Figure 4:
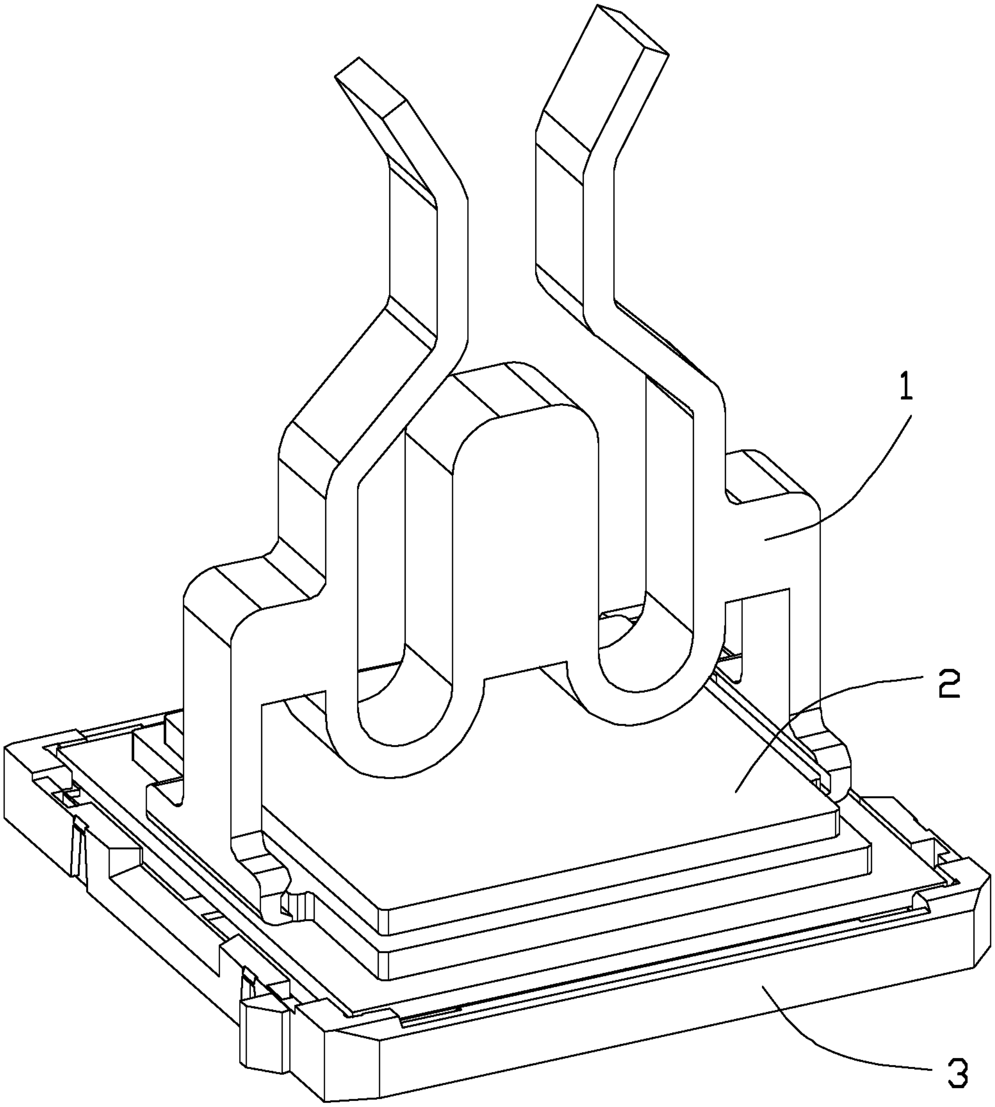
FIG. 4 is another schematic view showing the IC package assembled to the electrical connector.
Figure 5:
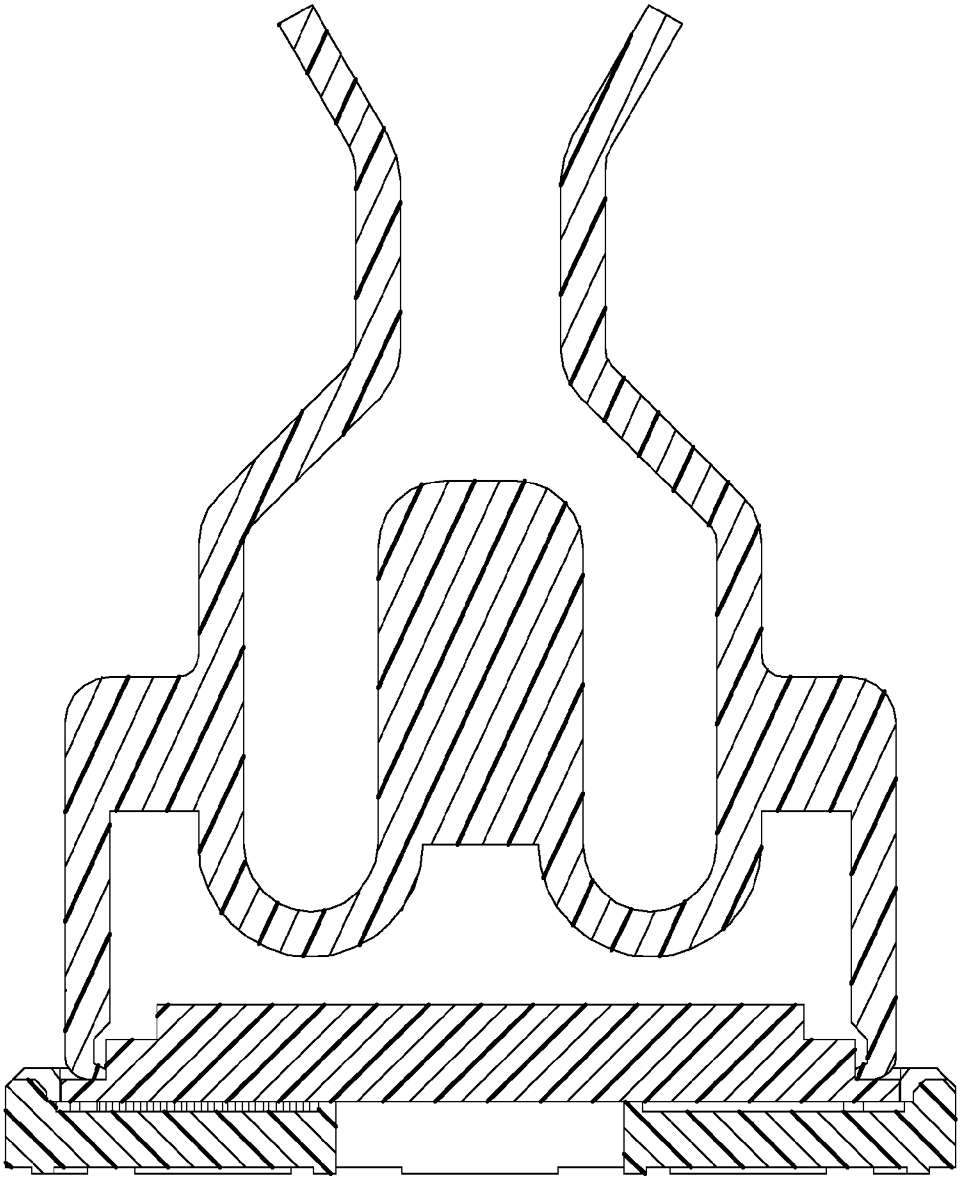
FIG. 5 is a cross-sectional view of the IC package assembled to the electrical connector of FIG. 4.

Referring to FIG. 3 and FIG. 4, when the operation arms 120 are pressed to rotate inwardly by an operator, the operation arms 120 will bring the clamping arms 130 to open, then the holding slot 133 of the clasping portion 132 will aim at the flange 25 of the IC package 2 wherein an inward tip of the clasping portion 132 abuts against a side of the flange 25 of the IC package 2. Referring to FIG. 5, when the clamping arms 130 are released by the operator, the clamping arms 130 will restore to an original position, then the tool 1 by the inward tip (not labeled) of the clasping portion 132 around the holding slot 133 holds the IC package 2 via holding the flange 25 of the IC package 2. When the tool 1 is moved by the operator, the tool 1 will bring the IC package 2 to the receiving space 35 of the electrical connector 3. Then the operator gives an inward force to the operation arms 120, and this leads the clamping arms 130 to open. So the IC package 2 is released when the clasping portion 132 is separated from the flange 25. Understandably, the base 110 provides the holding areas on two opposite exterior surfaces each in a vertical plane defined by the first transverse direction and the vertical direction to allow the operator to grasp on the two opposite exterior surfaces in the front-to-back direction wherein the width of the base 110 in the transverse direction is larger than a thickness of either the operation arms 120 or the clamping arms 130 in the transverse direction for easy/reliable grasping of the tool 1 by the user's fingers during loading/uploading the IC package with regard to the connector.

In this embodiment, the tool 1 is made of plastic or metal. The tool 1 can place the IC package 2 into the receiving space 35 of the electrical connector 3 or remove the IC package 2 from the receiving space 35 of the electrical connector 3 without touching the terminals 30 of the electrical connector 3. In this embodiment, the narrowest position of said pair of operation arms 120 is dimensioned to be less than one fourth of the widest position of said pair of clamping arms 130 for easy inward deflecting the pair of operation arms 120.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A tool for catching an IC package comprising:
 a main body having a base and a pair of lateral portions rotating relative to the base,
 a pair of operation arms extending upwardly from top portions of the corresponding lateral portions, respectively;
 a pair of clamping arms extending downwardly from the corresponding lateral portions respectively, each of said clamping arms forming a clasping portion at a free end thereof;
 wherein during operation, the operation arms bring the lateral portions to rotate inwardly and open the clamping arms;
 wherein said pair of lateral portions are located on two sides of the base, and each of the lateral portions connects with the operation arm and the clamping arm;
 wherein each of the lateral portions connects with the base at the bottom, and the lateral portion and the base form a gap to provide a rotating space for the lateral portion;
 wherein each of the operation arms includes a first segment extending from the top of the lateral portion upwardly and inwardly along an inclined direction, a second segment extending from the to of the first segment upwardly and a third segment extending from the top of the second segment upwardly and outwardly along an inclined direction, the operation arm forms a notch opening outwardly by the first segment, the second segment and the third segment, the notch is for an operator to place fingers;
 wherein the clamping arm includes a connecting segment and a clasping portion located at an end of the connecting segment, the connecting segment includes a horizontal portion extending from a middle-lower part of the lateral portion outwardly and a vertical portion extending downwardly from the horizontal portion; and
 wherein a thickness of each of the clasping portions is larger than the other parts of the tool that include the main body, the pair of operation arms and the connecting segments of the pair of clamping arms along a front-to-rear direction perpendicular to a longitudinal direction of the tool, the other parts of the tool have same thickness.

2. The tool as claimed in claim 1, wherein an arrangement direction of the base and the lateral portions define a longitudinal direction, a width of the base is larger than a width of the lateral portion along the longitudinal direction.

3. The tool as claimed in claim 1, wherein the clamping portion forms a holding slot which is adapted to receive a corresponding flange on a side of the IC package.

4. The tool as claimed in claim 1, wherein the holding slot runs through the clasping portion along the front-to-rear direction.

5. A tool for loading/unloading an IC (Integrated Circuit) package comprising:
 a main body having a base and a pair of lateral portions extending on two opposite lateral sides of the base, respectively in a transverse direction, each of said lateral portions cooperating with the base to form at least an upstanding U-shaped configuration in a vertical direction perpendicular to said transverse direction;
 a pair of operation arms upwardly extending in the vertical direction from the lateral portions, respectively;
 a pair of clamping arms downwardly extending in the vertical direction from the lateral portions, each of the pair of clamping arms includes a connecting segment and a clasping portion located at an end of the connecting segment;
 wherein the operation arms are located on an inward position with regard to the corresponding pair of lateral portions along said transverse direction while the clamping arms are located on an outward position with regard to the corresponding pair of lateral portions along said transverse direction;
 wherein when the pair of operation arms move toward each other in the transverse direction, the corresponding U-shaped configurations are inwardly deformed and the clamping arms move away from each other in the transverse direction;

wherein the base extends upwardly in the vertical direction and terminates at a level around a lower end of the corresponding operation arm;

wherein each of said clamping arms forms the clasping portion at a free end where an inward tip is located, and each of said clamping arms defines an upside-down L-shaped structure including a horizontal part unitarily extending transversely from the corresponding lateral portion, and a vertical part unitarily extending downwardly from the horizontal part with the inward tip formed at the free end of the vertical part; and wherein a thickness of each of the clasping portions is larger than the other parts of the tool that include the main body, the pair of operation arms and the connecting segments of the pair of clamping arms along a front-to-rear direction perpendicular to a longitudinal direction of the tool, the other parts of the tool have same thickness.

6. The tool as claimed in claim 5, wherein a bottom region of each upstanding U-shaped configuration functions as a fulcrum during deformation.

7. The tool as claimed in claim 5, wherein a narrowest position of said pair of operation arms is dimensioned to be less than one third of a widest position of the clamping arms.

8. The tool as claimed in claim 5, wherein the operation arm extends from a first position of the corresponding lateral portion while the clamping arm extends from a second position of the corresponding lateral portion, said first position being higher than the second position in the vertical direction.

9. The tool as claimed in claim 5, wherein the base provides holding areas on two opposite exterior surfaces in a front-to-back direction perpendicular to both said transverse direction and said vertical direction, and a width of said base in the transverse direction is larger than a thickness of either the operation arms or the clamping arms in the front-to-back direction.

10. An electrical connector assembly comprising:

an electrical connector;

an IC (Integrated Circuit) package received within the electrical connector;

a tool for loading/unloading the IC package with regard to the connector, including: a main body generally defining at least an upstanding W-shaped configuration in a front view along a front-to-back direction and having a base and a pair of lateral portions extending on two opposite lateral sides of the base, respectively in a transverse direction perpendicular to said front-to-back direction;

a pair of operation arms upwardly extending from the lateral portions, respectively, in a vertical direction perpendicular to both said front-to-back direction and said transverse direction;

a pair of clamping arms downwardly extending in the vertical direction from the lateral portions, each of the pair of clamping arms includes a connecting segment and a clasping portion located at an end of the connecting segment;

wherein the operation arms are located on an inward position with regard to the corresponding pair of lateral portions along said transverse direction while the clamping arms are located on an outward position with regard to the corresponding pair of lateral portions along said transverse direction;

wherein when the pair of operation arms move toward each other in the transverse direction, the corresponding W-shaped configurations are deformed and the clamping arms move away from each other in the transverse direction;

wherein the IC package includes a pair of flanges in the transverse direction, and the clamping arms grasp the flanges in the transverse direction during loading/unloading;

wherein a narrowest position of said pair of operation arms is dimensioned to be less than one third of a widest position of the clamping arms;

wherein said connector forms a pair of notches in two lateral side walls and in alignment with the flanges, respectively, in the transverse direction; and wherein a thickness of each of the clasping portions is larger than the other parts of the tool that include the main body, the pair of operation arms and the connecting segments of the pair of clamping arms along a front-to-rear direction perpendicular to a longitudinal direction of the tool, the other parts of the tool have same thickness.

11. The electrical connector assembly as claimed in claim 10, wherein the operation arm extends from a first position of the corresponding lateral portion while the clamping arm extends from a second position of the corresponding lateral portion, said first position being different from and higher than the second position in the vertical direction.

* * * * *